(12) United States Patent
Carragher et al.

(10) Patent No.: US 6,693,477 B2
(45) Date of Patent: Feb. 17, 2004

(54) CLOCK CIRCUIT FOR A MICROPROCESSOR

(75) Inventors: Mark A. J. Carragher, Guelph (CA); John W. Wynen, Conestogo (CA)

(73) Assignee: Research in Motion Limited, Waterloo (CA)

(*) Notice: Subject to any disclaimer, the term of this patent is extended or adjusted under 35 U.S.C. 154(b) by 55 days.

(21) Appl. No.: 10/004,136

(22) Filed: Oct. 22, 2001

(65) Prior Publication Data

US 2003/0076146 A1 Apr. 24, 2003

(51) Int. Cl.[7] .................................................. G06F 1/04
(52) U.S. Cl. ........................ 327/291; 327/294; 327/298
(58) Field of Search ................................. 327/291, 292, 327/293, 294, 297, 298, 407, 408, 520, 526, 105, 113, 114, 147, 144, 154, 155, 99

(56) References Cited

U.S. PATENT DOCUMENTS

| 4,464,748 A | * | 8/1984 | Krikor .......................... 370/58 |
| 4,672,603 A | * | 6/1987 | Conforti ....................... 370/58 |
| 4,746,899 A | * | 5/1988 | Swanson et al. ............. 340/347 |
| 5,502,409 A | * | 3/1996 | Schnizlein et al. ............ 327/99 |
| 5,528,201 A | * | 6/1996 | Davis .................... 331/116 FE |
| 5,666,388 A | * | 9/1997 | Neron ......................... 375/376 |
| 5,706,004 A | * | 1/1998 | Yeung ......................... 341/122 |
| 5,877,636 A | * | 3/1999 | Truong et al. ................. 327/99 |
| 5,926,044 A | * | 7/1999 | Niimura ........................ 327/99 |
| 5,943,290 A | * | 8/1999 | Robinson et al. ............ 365/233 |
| 6,057,791 A | * | 5/2000 | Knapp ......................... 341/122 |
| 6,157,265 A | * | 12/2000 | Hanjani ....................... 331/49 |
| 6,341,355 B1 | * | 1/2002 | Rutherford et al. .......... 713/501 |
| 6,411,134 B1 | * | 6/2002 | Manz et al. ................... 327/99 |

* cited by examiner

Primary Examiner—Timothy P. Callahan
Assistant Examiner—Hai L. Nguyen
(74) Attorney, Agent, or Firm—Jones Day; Krishna K. Pathiyal, Esq.; Charles B. Meyer, Esq.

(57) ABSTRACT

A clock circuit comprises an analog clock element, a digital clock element, and a controller. The analog clock element is configured to generate an oscillating output. The digital clock element is configured to generate a digital clock output. The controller is configured to switch between the analog clock element and the digital clock element. The oscillating output and the digital clock output have substantially equivalent frequencies.

18 Claims, 2 Drawing Sheets

CLOCK CIRCUIT FOR A MICROPROCESSOR

BACKGROUND

1. Field of the Invention

The present invention provides a clock circuit for microprocessors. This invention is particularly well-suited for use in Personal Digital Assistants, mobile communication devices, cellular phones, and wireless two-way email communication devices (collectively referred to herein as "mobile devices"). The invention may provide utility, however, in any device that is subjected to high levels of electromagnetic interference.

2. Description of the Related Art

Known clock circuits commonly include crystal oscillators that resonate at a certain frequency. Once the crystal oscillator begins vibrating at its resonant frequency, the resonant frequency is typically maintained by feeding back an in-phase signal from one terminal of the crystal oscillator to the other terminal of the crystal oscillator. This allows the clock circuit to generate a substantially constant clock speed.

Known clock circuits generally have high impedances in order to reduce power consumption. The clock circuit's high impedance, however, makes it susceptible to interference from strong electromagnetic signal sources. For example, in a mobile device, a transmission circuit may include a power amplifier that interferes with the clock circuit during transmission, temporarily changing the frequency of the oscillator.

Typical mobile devices isolate the clock circuit from the strong electromagnetic interference that occurs during transmission by shielding the clock circuit with an EMI shield. In addition, a typical mobile device may include an external buffer amplifier that protects the integrity of the clock circuit. These known techniques generally add complexity and high component counts to the device. Furthermore, these techniques may require the circuit to restart the crystal oscillator in the event that the oscillation has stopped or slowed as a result of a strong interference signal.

SUMMARY

A clock circuit is disclosed which comprises an analog clock element, a digital clock element, and a controller. The analog clock element is configured to generate an oscillating output. The digital clock element is configured to generate a digital clock output. The controller is configured to switch between the analog clock element and the digital clock element. The oscillating output and the digital clock output have substantially equivalent frequencies.

In a first embodiment of the present invention, a clock circuit for a mobile device has a clock circuit output and comprises a state signal having a first state and a second state, wherein the state signal is in the first state while the mobile device is transmitting, a controller coupled to the state signal, the controller being configured to generate a digital clock enabling signal when the state signal is in the first state and to generate an analog clock enabling signal when the state signal is in the second state, an analog clock circuit coupled to the controller to receive the analog clock enabling signal and configured to generate an oscillating output, wherein the oscillating output is enabled as the clock circuit output when the analog clock circuit receives the analog clock enabling signal from the controller, and a digital clock circuit coupled to the controller to receive the digital clock enabling signal and configured to generate a digital clock output having a frequency that is substantially equal to the frequency of the oscillating output, wherein the digital clock output is enabled as the clock circuit output when the digital clock circuit receives the digital clock enabling signal from the controller.

According to a further aspect of the present invention, a clock circuit comprises an analog clock element configured to generate an oscillating output, a digital clock element configured to generate a digital clock output, and a controller configured to switch between the analog clock element and the digital clock element, wherein the oscillating output and the digital clock output have substantially equivalent frequencies.

In a still further embodiment of the invention, a method of isolating a crystal oscillator in a mobile device from electromagnetic interference comprises the steps of receiving a state signal which indicates that generation of an electromagnetic field near the crystal oscillator is anticipated, detecting an edge of a clock circuit signal after the state signal has been received, and enabling a digital clock circuit and disabling the crystal oscillator from the clock circuit when the edge is detected.

A method of maintaining oscillation of a crystal oscillator, according to another aspect of the invention, comprises the steps of detecting an edge of a clock circuit signal, enabling a digital clock circuit when the edge is detected, and driving the crystal oscillator with the digital clock circuit, wherein the output of the digital clock circuit and the crystal have substantially equivalent frequencies.

DETAILED DESCRIPTION OF THE DRAWINGS

Figure 1:
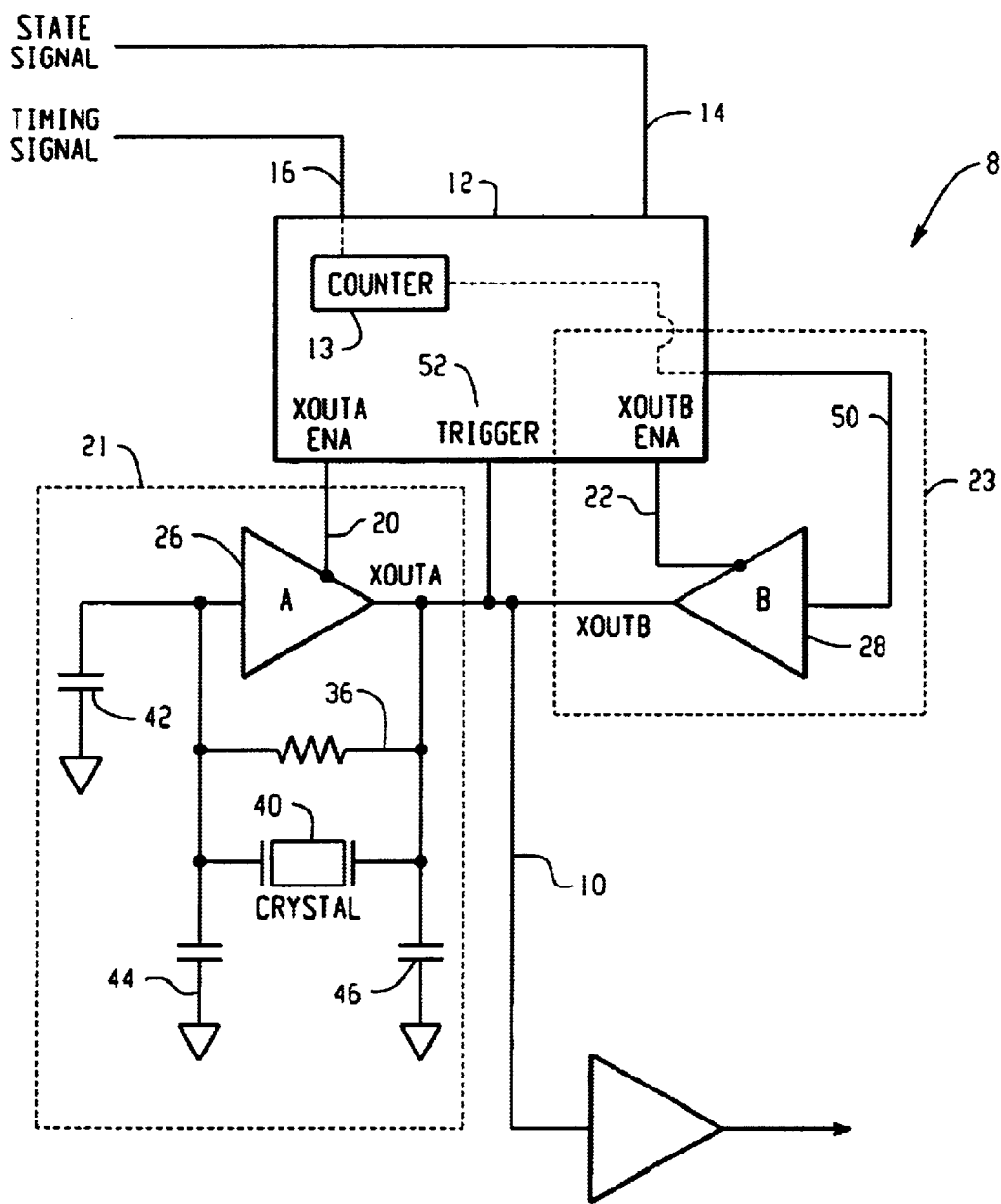
FIG. 1 is a circuit diagram of an exemplary clock circuit according to the present invention.

With reference to the drawing figures, FIG. 1 is a circuit diagram of an exemplary clock circuit according to the present invention. The clock circuit includes a controller 12, an analog clock element 21, a digital clock element 23, a state signal 14 and a timing signal 16. The state signal 14 may, for example, be coupled to the transmission circuitry of a mobile device and configured to deliver a high pulse while the mobile device is transmitting. The timing signal 16 may, for example, be generated by a frequency synthesizer in a mobile device. The controller 12 is coupled to the timing signal 16 and the state signal 14, and generates an analog clock enabling signal 20 and a digital clock enabling signal 22. The analog clock enabling signal 20 is coupled to the analog clock element 21, and the digital clock enabling signal 22 is coupled to the digital clock element 23. The respective output terminals of the analog and digital clock elements 21 and 23 are coupled together to generate the clock signal 10, which is output to be used by other circuits (not shown), possibly through an output buffer 11. In addition, the clock signal 10 is coupled as a trigger input 52 to the controller 12, and operates to synchronize the switching of the enabling signals 20 and 22 such that the switching operation occurs timely to both the period of the clock signal 10 and either a leading or falling edge of the timing signal 16. The relationship between the trigger input 52, the timing signal 16 and the enabling signals 20 and 22 is discussed below in more detail with reference to FIG. 2.

Operationally, the controller 12 enables either the analog clock element 21 or the digital clock element 23 as a function of the state signal 14. For instance, while a mobile device is either idle or receiving a transmission, the state signal 14 may be in a first state, causing the controller 12 to enable the analog control element 21. Then, while the mobile device is transmitting, the state signal 14 may be in a second state, causing the controller 12 to enable the digital clock element 23. In this manner, the clock circuit 14 isolates the analog clock element 21 from the electromagnetic interference that is typically generated while the mobile device is transmitting, and thus maintains a substantially constant clock signal 10.

The analog clock element 21 preferably includes the oscillator amplifier 26, a resistor 36, a crystal oscillator 40, and a plurality of capacitors 42, 44, and 46. The crystal oscillator 40, the oscillator amplifier 26, and the resistor 36 are coupled in parallel. The capacitors 42 and 44 are coupled in series between ground and the input of the oscillator amplifier 26. The capacitor 46 is coupled in series between the output of the oscillator amplifier 26 and ground. The resistor 36 is a negative feedback element that couples the output voltage of the amplifier 26 to both the input of the crystal oscillator 40 and the amplifier 26. In addition, the resistor 36 biases the amplifier 26 such that the amplifier 26 operates in a high-gain linear region. Together, the amplifier 26 and the capacitors 44 and 46 shift the phase of the output to maintain oscillation. The values of the resistor 36 and the capacitors 44 and 46 are preferably determined by the desired gain of the amplifier 26 and the load capacitance of the crystal oscillator 40, respectively. In one alternative embodiment, the analog clock circuit 21 may also include an additional resistor between the output of the crystal oscillator 40 and output of the resistor 36.

The digital clock element 23 includes the digital amplifier 28 coupled to a frequency matching output 50 from the controller 12. The frequency matching output 50 is preferably a square wave generated by the controller 12 that has a frequency substantially equal to the frequency of the analog element 21. The frequency matching output 50 may be generated, for example, by a divider (counter) 13 internal to the controller 12 that counts cycles of the timing signal 16. The output of the digital counter 13 is coupled to the input terminal of the amplifier 28. In this manner, the frequency matching output 50 is generated by dividing the frequency of the timing signal 16. For instance, after a predetermined number of cycles of the timing signal 16 have been counted, then the controller 12 can change the signal level of the frequency matching output 50 from the low level to the high level or, if the frequency output is high, from the high level to the low level. When the digital amplifier 28 is enabled by the digital enabling signal 22, the digital amplifier 28 generates the clock signal 10 with a frequency substantially equal to the frequency of the frequency matching output 50.

Operationally, the state signal 14 determines which clock element 21 or 23 generates the clock signal 10. When the state signal 14 is in a first state, the oscillating amplifier 26 is enabled, the digital amplifier 28 is disabled, and the clock signal 10 is generated by the analog clock element 21. When the state signal 14 changes state, the controller 12 preferably waits for a trigger input 52 and a new cycle in the timing signal 16, and then reverses the states of the enabling signals 20 and 22. Once the state change has been triggered, the digital amplifier 28 is enabled, the oscillating amplifier 26 is disabled, and the clock signal 10 is generated by the digital clock element 23. In addition, the clock signal 10 from the digital amplifier 28 is coupled to the crystal oscillator 40 through the feedback resistor 36 to enable the crystal oscillator 40 to continue to oscillate while the oscillating amplifier 26 is disabled.

Figure 2:
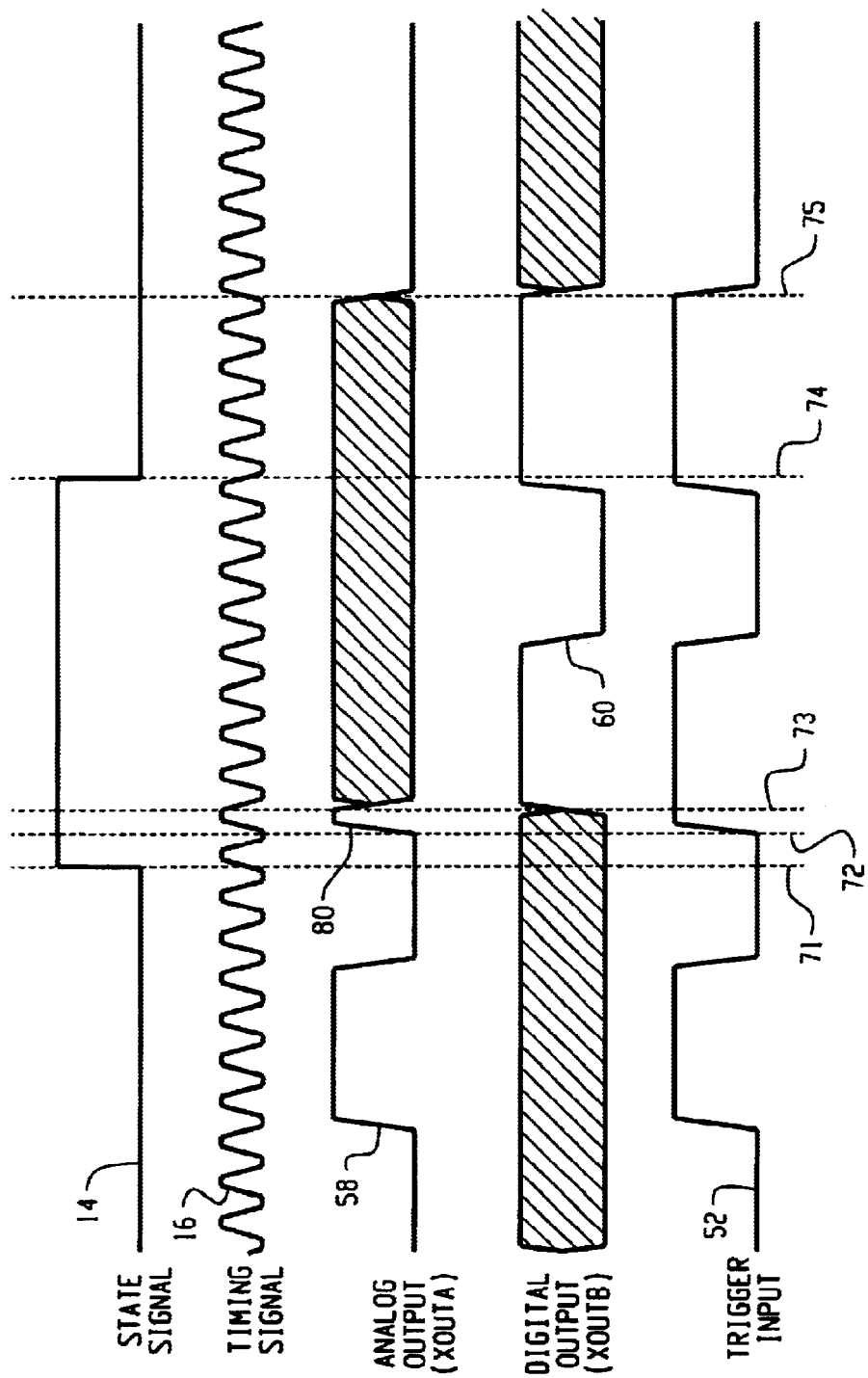
FIG. 2 is a timing diagram related to the circuit shown in FIG. 1.

FIG. 2 is a timing diagram related to the circuit shown in FIG. 1. The timing diagram includes the state signal 14, the timing signal 16, an analog output signal 58 (xouta), a digital output signal 60 (xoutb), and the trigger input 52. The timing diagram also shows five dotted lines 71, 72, 73, 74 and 75 that are included to refer to points in time when significant signal changes occur, and are respectively referred to hereinafter as REF 71, REF 72, REF 73, REF 74 and REF 75.

In a left to right view of the signals, the oscillator amplifier 26 is initially enabled, generating an alternating high/low pulse as the analog output signal 58. The digital amplifier 28 is initially disabled, with the digital output 60 in a high impedance state. The trigger input 52, which is coupled both to the analog and digital output signals 58, is initially driven by the analog output signal 58.

At REF 71, the state signal 14 changes states (from low to high), instructing the controller 12 to switch from the analog clock element 21 to the digital clock element 23. In order to synchronize the clock element switch with the clock output 10, the controller 12 preferably waits for the rising edge of the clock pulse 10 at its trigger input 52, indicating the beginning of a new cycle in the clock output 10. This is shown in FIG. 2 at REF 72. In addition, because the digital output 60 is generated as a function of the timing signal 16 as described above, the digital and analog clock elements 21 and 23 should preferably not be switched until the timing signal 16 starts a new cycle at REF 73. Otherwise, the clock output 10 could be switched over to the digital clock element 23 before the controller begins dividing the timing signal 16 to generate the frequency matching output 50, resulting in a glitch in the clock output 10. Thus, from REF 71 until REF 73 the clock output 10 (and trigger input 52) is driven by the analog output 58. This results in a short delayed pulse 80 from the analog output 58 that occurs before the clock elements 21 and 23 are switched at REF 73.

From REF 73 to REF 74, the digital amplifier 28 is enabled, generating an alternating high/low pulse as the digital output signal 60 that has a frequency substantially equal to the oscillation frequency of the oscillator 40. The oscillator amplifier 26 is disabled, and its output assumes a high impedance state. The trigger input 52 is being driven by the digital output signal 60.

At REF 74, the state signal 14 again changes states (from high to low), instructing the controller 12 to switch back to the analog clock element 21. As explained above, while the analog clock element 21 is disabled, the oscillator 40 is driven by the digital output signal 60 and thus maintains synchronization with the clock output 10. Therefore, when the controller 12 receives a state signal 14 at REF 74, instructing a switch from the digital clock element 23 to the analog clock element 21, the controller 12 preferably only waits for an appropriate signal on its trigger input 52 before initiating the switch. In a preferred embodiment, the switch between the digital output 60 and the analog output 58 is triggered at the falling edge of the trigger input signal 52 (REF 75) to avoid glitches in the clock output 10.

In one exemplary embodiment, the timing circuit 8 described above with reference to FIGS. 1 and 2, may be implemented in a wireless communication device. For example, a handheld, wireless communication device may communicate with a base station through a wireless modem. When the handheld device is idle or is otherwise not communicating, the device sends a low state signal 14 to the circuit 8. The circuit synchronizes the microprocessor of the device using the analog clock element 21 which preferably resonates with a 32.768 kHz crystal. During this time, the digital clock element 23 remains in a disabled state and the digital amplifier output is in a high impedance state.

When the handheld device is communicating with the base station and thus generating a high level of electromagnetic interference, the device sends a high state signal 14 to the circuit 8. The high state signal 14 alerts the controller 12 to switch between the analog clock element 21 and the digital clock element 23. When an edge of the analog output signal 58 is sensed at the trigger input 52, then the controller disables the analog element 21 and enables the digital element 23. The crystal is then protected from the high EMI fields associated with communication signals that may otherwise overwhelm the crystal oscillator 40 when the handheld device is transmitting voice and/or data messages. Other electromagnetic disturbances may similarly be anticipated by the device to initiate a switch from the analog clock element 21 to the digital clock element 23.

The embodiments described herein are examples of structures, systems or methods having elements corresponding to the elements of the invention recited in the claims. This written description may enable those skilled in the art to make and use embodiments having alternative elements that likewise correspond to the elements of the invention recited in the claims. The intended scope of the invention thus includes other structures, systems or methods that do not differ from the literal language of the claims, and further includes other structures, systems or methods with insubstantial differences from the literal language of the claims.

What is claimed is:

1. A clock circuit for a mobile device, the clock circuit having a clock circuit output, comprising:
    a state signal having a first state and a second state, wherein the state signal is in the first state while the mobile device is transmitting;
    a controller coupled to the state signal, the controller being configured to generate a digital clock enabling signal when the state signal is in the first state and to generate an analog clock enabling signal when the state signal is in the second state;
    an analog clock circuit coupled to the controller to receive the analog clock enabling signal and configured to generate an oscillating output, wherein the oscillating output is enabled as the clock circuit output when the analog clock circuit receives the analog clock enabling signal from the controller; and
    a digital clock circuit coupled to the controller to receive the digital clock enabling signal and configured to generate a digital clock output having a frequency that is substantially equal to the frequency of the oscillating output, wherein the digital clock output is enabled as the clock circuit output when the digital clock circuit receives the digital clock enabling signal from the controller.

2. The clock circuit of claim 1, wherein the analog clock circuit comprises a crystal oscillator.

3. The clock circuit of claim 2, wherein the analog clock circuit further comprises:
    an amplifier having an input terminal and an output terminal, wherein the crystal oscillator is coupled between the input terminal and the output terminal of the amplifier, the output of the amplifier being the oscillating output.

4. The clock circuit of claim 3, wherein the analog clock circuit further comprises:
    a feedback resistor coupled between the input terminal and the output terminal of the amplifier.

5. The clock circuit of claim 4, wherein the feedback resistor biases the amplifier.

6. The clock circuit of claim 3, wherein the analog clock circuit further comprises:
    a first capacitor coupled between the input terminal of the amplifier and ground; and
    a second capacitor coupled between the output terminal of the amplifier and ground;
    whereby the amplifier, the first capacitor, and the second capacitor together shift the phase of the oscillating output such that the crystal oscillator maintains oscillation.

7. The clock circuit of claim 3, wherein the amplifier is also coupled to the controller to receive the analog clock enabling signal, the amplifier being configured to generate the oscillating output when the analog clock enabling signal is sent from the controller to the analog clock circuit.

8. The clock circuit of claim 1, wherein the digital clock circuit comprises a digital counter coupled to a timing signal and configured to count cycles of the timing signal, the digital counter generates a pulse after a predetermined number of cycles wherein the pulse sets the frequency of the digital clock output.

9. The clock circuit of claim 8, wherein a pulse signal comprising a plurality of pulses from the digital counter has a frequency substantially equal to the frequency of the digital clock output.

10. The clock circuit of claim 9, wherein the digital clock circuit further comprises:
    an amplifier having an input terminal and an output terminal, wherein the output of the digital counter is coupled to the input terminal of the amplifier, the output of the amplifier being the digital clock output.

11. The clock circuit of claim 10, wherein the amplifier is also coupled to the controller to receive the digital clock enabling signal, the amplifier being configured to generate the digital clock output when the digital clock enabling signal is sent from the controller to the digital clock circuit.

12. The clock circuit of claim 1, wherein the oscillating output and the digital clock output each have a rising edge, the controller further being configured to follow the rising edge of the digital clock output to the rising edge of the oscillating output when the state signal switches from the second state to the first state.

13. The clock circuit of claim 1, wherein the oscillating output and the digital clock output each have a falling edge, the controller further being configured to match the falling edge of the oscillating output to the falling edge of the digital clock output.

14. The clock circuit of claim 1, where the clock circuit paces a microprocessor in a mobile device.

15. A clock circuit comprising:
    an analog clock element configured to generate an oscillating output, the analog clock element comprises a crystal oscillator and an amplifier having an input terminal and an output terminal, wherein the crystal oscillator is coupled between the input terminal and the output terminal of the amplifier, the output of the amplifier being the oscillating output;
    a digital clock element configured to generate a digital clock output; and
    a controller configured to switch between the analog clock element and the digital clock element;

wherein the oscillating output and the digital clock output have substantially equivalent frequencies, and wherein the controller generates an analog clock enabling signal when the controller determines to switch from the digital clock element to the analog clock element, the amplifier being coupled to the controller to receive the analog clock enabling signal and configured to generate the oscillating output when the analog clock enabling signal is sent from the controller to the analog clock element.

16. A method of isolating a crystal oscillator in a mobile device from electromagnetic interference, comprising the steps of:

receiving a state signal which indicates an electromagnetic field is generated near the crystal oscillator;

detecting an edge of a clock circuit signal generated by a clock circuit after the state signal has been received; and enabling a digital clock circuit and disabling the crystal oscillator from the clock circuit when the edge is detected.

17. The method of claim 16, wherein the electromagnetic field is a transmission signal.

18. The method of claim 16, further comprising the step of driving the crystal oscillator with the digital clock circuit when a falling edge is detected.

* * * * *